United States Patent
Koto et al.

(10) Patent No.: US 7,348,800 B2
(45) Date of Patent: Mar. 25, 2008

(54) LEVEL SHIFT CIRCUIT

(75) Inventors: Masaaki Koto, Osaka (JP); Kazuhito Kimura, Kyoto (JP); Takuya Ishii, Osaka (JP); Kazuyuki Moritake, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 33 days.

(21) Appl. No.: 11/495,774

(22) Filed: Jul. 31, 2006

(65) Prior Publication Data
US 2007/0085566 A1 Apr. 19, 2007

(30) Foreign Application Priority Data
Oct. 19, 2005 (JP) ............... 2005-304447

(51) Int. Cl.
*H03K 19/0175* (2006.01)
(52) U.S. Cl. ............... 326/80; 326/68; 326/82; 327/333
(58) Field of Classification Search .......... 326/68, 326/80, 81, 82, 83, 86; 327/333
See application file for complete search history.

(56) References Cited

U.S. PATENT DOCUMENTS 5,204,557 A * 4/1993 Nguyen .............. 326/81

2005/0258864 A1 * 11/2005 Chen et al. ............. 326/81

FOREIGN PATENT DOCUMENTS

JP 2001-223575 8/2001

* cited by examiner

*Primary Examiner*—Rexford Barnie
*Assistant Examiner*—Crystal L Hammond
(74) *Attorney, Agent, or Firm*—McDermott Will & Emery LLP

(57) ABSTRACT

A level shift circuit has a driving circuit and an output circuit. The driving circuit has a clamp circuit for receiving first and second bias potentials, outputting first and second drive signals which are not less than a reference potential, less than the first bias potential, and complementary to each other, and also outputting third and fourth drive signals which are higher than the second bias potential, not more than a power source potential, and complementary to each other. The output circuit has a first output transistor of a first conductivity type and a second output transistor of a second conductivity type which are connected in series to each other. The first output transistor has a gate for receiving the first drive signal and one electrode for receiving the reference potential. The second output transistor has a gate for receiving the third drive signal and one electrode for receiving the power source potential.

8 Claims, 7 Drawing Sheets

LEVEL SHIFT CIRCUIT

CROSS REFERENCE TO RELATED APPLICATIONS

The teachings of Japanese Patent Application JP 2005-304447, filed Oct. 19, 2005, are entirely incorporated herein by reference, inclusive of the claims, specification, and drawings.

BACKGROUND OF THE INVENTION

The present invention relates to a level shift circuit for outputting a signal with a high-voltage amplitude.

In recent years, as semiconductor devices have been reduced further in size and power consumption, power source voltages have increasingly lowered. On the other hand, circuits which require high-voltage drive signals are still present so that a level shift circuit for outputting a signal with a high-voltage amplitude is in demand. In the level shift circuit, it is normally necessary to adjust the gate-source breakdown voltage of an output-stage transistor to a level higher than the amplitude voltage of an output signal therefrom. A circuit which includes a high-breakdown-voltage transistor and a low-breakdown-voltage transistor in mixed relation is complicated in circuit design and fabrication process. Moreover, since the high-breakdown-voltage transistor is large in size, the area occupied by the semiconductor device is increased disadvantageously. In view of the foregoing, a method has been examined which allows a level shift circuit for outputting a signal with a high-voltage amplitude to be implemented without using a transistor with a high gate-source breakdown voltage.

For example, Japanese Laid-Open Patent Publication No. 2001-223575 discloses the following level shift circuit. FIG. 7 shows a circuit structure of a level shift circuit according to a conventional embodiment. As shown in FIG. 7, the conventional level shift circuit comprises: an inverter 121 connected between a low-voltage power source terminal $T_{VDD}$ and a ground terminal $T_{VSS}$ and driven by an input signal. The conventional level shift circuit also comprises: a latch circuit 123 connected between the high-voltage power source terminal $T_{HVDD}$ and a low-voltage logic terminal $T_{HVSS}$ and having an input connected to the output of the inverter 121 via a capacitor 120; and an inverter 125 connected to the output of the latch circuit 123. Each of the outputs of the inverters 121 and 125 is connected to an output circuit 122 connected between the high-voltage power source terminal $T_{HVDD}$ and the ground terminal $T_{VSS}$.

The output circuit 122 is composed of a PMOS output transistor MO102 and an NMOS output transistor MO101 which are connected in series to each other such that the PMOS output transistor MO102 is connected to the high-voltage power source terminal $T_{HVDD}$ and NMOS output transistor MO101 is connected to the ground terminal $T_{VSS}$. The connecting point between the PMOS output transistor MO102 and the NMOS output transistor MO101 is connected to the output terminal $T_{OUT}$. The gate of the PMOS output transistor MO102 is connected to the output of the inverter 125. The gate of the NMOS output transistor MO101 is connected to the output of the inverter 121.

The potential at the ground terminal $T_{VSS}$ is a ground potential $V_{SS}$. The potential at the low-voltage power source terminal $T_{VDD}$ is $V_{DD}$. The potential at the high-voltage power source terminal $T_{HVDD}$ is $HV_{DD}$. The potential at the low-voltage logic terminal $T_{HVSS}$ is $H_{VSS}$. The voltage between the low-voltage power source terminal $T_{VDD}$ and the ground terminal $T_{VSS}$ and the voltage between the high-voltage power source terminal $T_{HVDD}$ and the low-voltage logic terminal $T_{HVSS}$ are not more than the gate-source breakdown voltage of each of the transistors composing the circuit. The voltage between the high-voltage power source terminal $T_{HVDD}$ and the ground terminal $T_{VSS}$ is not less than the gate-source breakdown voltage of each of the transistors.

When a logic signal at the $V_{DD}$ level is inputted as an input signal from the input terminal $T_{IN}$ and the input signal shifts to the low level, the NMOS output transistor MO101 is turned ON. In addition, a drive signal at the high level is inputted to the latch circuit 123 via the capacitor 120. The PMOS output transistor MO102 is turned OFF by a drive signal outputted from the inverter 125 based on the inputted drive signal. As a result, the potential at the output terminal Tour becomes $V_{SS}$.

On the other hand, when the input signal is at the high level, the NMOS output transistor MO101 is turned OFF. In addition, a drive signal at the low level is inputted to the latch circuit 123 via the capacitor 120. The PMOS output transistor MO102 is turned ON by a drive signal outputted from the inverter 125 based on the inputted drive signal and the potential at the output terminal $T_{OUT}$ becomes $HV_{DD}$.

In this case, a drive signal is supplied from the inverter 121 to the output circuit 122 via the latch circuit 123 to the output circuit 122 through current transmission by the capacitor 120. Accordingly, no dc path is present so that a signal with a low-voltage amplitude between the high-voltage power source terminal $T_{HVDD}$ and the low-voltage logic terminal $T_{HVSS}$ is applied between the gate and source of each of the NMOS output transistor MO101 and the PMOS output transistor MO102. Therefore, it is necessary for the source-drain breakdown voltages of the NMOS output transistor MO101 and the PMOS output transistor MO102 to be set high but, it is sufficient for the gate-source breakdown voltages thereof to be the same as those of the other transistors.

However, the conventional level shift circuit mentioned above has the problem that it requires a high-breakdown-voltage capacitor. The high-breakdown-voltage capacitor occupies an area about 100 times as large as the area occupied by a typical transistor. Therefore, the conventional level shift circuit need not use a transistor with a high gate-source breakdown voltage, but the effect of reducing the area occupied by the semiconductor device can hardly be expected therefrom.

SUMMARY OF THE INVENTION

It is therefore an object of the present invention to solve the conventional problem described above and allows a level shift circuit which features easy circuit design and easy fabrication and outputs a signal with an amplitude exceeding the gate-source breakdown voltage of each of transistors composing the circuit to be implemented without using a high-breakdown-voltage capacitor.

To attain the object described above, a level shift circuit according to the present invention is constructed to include a clamp circuit.

Specifically, the level shift circuit according to the present invention comprises: a driving circuit including a clamp circuit for receiving first and second bias potentials, outputting first and second drive signals at potentials which are not less than a reference potential, less than the first bias potential, and complementary to each other, and also outputting third and fourth drive signals which are higher than the second bias potential, not more than a power source potential, and complementary to each other; and an output circuit including a first output transistor of a first conductivity type and a second output transistor of a second conductivity type which are connected in series to each other, the first output transistor having a gate for receiving the first drive signal and one electrode for receiving the reference potential, the second output transistor having a gate for receiving the third drive signal and one electrode for receiving the power source potential.

Since the level shift circuit according to the present invention comprises the driving circuit including the clamp circuit for outputting the first and second drive signals which are not less than the reference potential, less than the first bias potential, and complementary to each other and also outputting the third and fourth drive signals which are higher than the second bias potential, not more than the power source potential, and complementary to each other, the amplitude voltage of the output signal is prevented from being applied directly to each of the transistors composing the level shift circuit. Accordingly, it becomes possible to output a voltage with an amplitude exceeding the gate-source breakdown voltage of the output transistor and construct the level shift circuit by using only transistors each having a low breakdown voltage. This allows easy circuit design and a reduction in the area occupied by the device.

In the level shift circuit according to the present invention, the driving circuit preferably includes: a first MOS transistor of the first conductivity type having a gate for receiving an input signal, one electrode for receiving the first drive signal, and the other electrode for receiving the reference potential; a second MOS transistor of the first conductivity type having a gate for receiving the inverted input signal, one electrode for receiving the second drive signal, and the other electrode for receiving the reference potential; a third MOS transistor of the second conductivity type having a gate for receiving the fourth drive signal, one electrode for receiving the third drive signal, and the other electrode for receiving the power source potential; and a fourth MOS transistor of the second conductivity type having a gate for receiving the third drive signal, one electrode for receiving the fourth drive signal, and the other electrode for receiving the power source potential. The arrangement allows the first and second drive signals which are complementary to each other and the third and fourth drive signals which are complementary to each other to be outputted reliably.

In the level shift circuit according to the present invention, a potential difference between the reference potential and the power source potential is preferably larger than a gate-source breakdown voltage of each of the first and second output transistors. In addition, each of the first and second output transistors is preferably a double-diffused MOS transistor. The arrangement allows an output at a higher voltage to be obtained and also allows easy circuit design.

In the level shift circuit according to the present invention, the clamp circuit preferably includes: a fifth MOS transistor of the first conductivity type and a sixth MOS transistor of the second conductivity type which are connected in series to each other such that the fifth MOS transistor is connected to a first output node for outputting the first drive signal and the sixth MOS transistor is connected to a third output node for outputting the third drive signal; and a seventh MOS transistor of the first conductivity type and an eighth MOS transistor of the second conductivity type which are connected in series to each other such that the seventh MOS transistor is connected to a second output node for outputting the second drive signal and the eighth MOS transistor is connected to a fourth output node for outputting the fourth drive signal, wherein a gate of each of the fifth and seventh MOS transistors preferably receives the first bias potential and a gate of each of the sixth and eighth MOS transistors preferably receives the second bias potential. The arrangement allows the clamp circuit to be constructed reliably.

Preferably, the level shift circuit according to the present invention further comprises: a first switch connected between the first and third output nodes; a second switch connected between the second and fourth output nodes; and a switch driving circuit for turning ON each of the first and second switches when the power source potential is not more than a specified value. The arrangement allows the level shift circuit to be driven at a high speed even in the case where the power source voltage varies greatly and becomes not more than the gate-source breakdown voltage of the transistor.

In this case, the first switch preferably includes a ninth MOS transistor of the first conductivity type and a tenth MOS transistor of the second conductivity type which are connected between the first and third output nodes, the second switch preferably includes an eleventh MOS transistor of the first conductivity type and a twelfth MOS transistor of the second conductivity type which are connected between the second and fourth output nodes, and the switch driving circuit preferably applies a high-level voltage to a gate of each of the ninth and eleventh MOS transistors and also applies a low-level voltage to a gate of each of the tenth and twelfth MOS transistors when the power source potential is not more than the specified value.

Preferably, the level shift circuit according to the present invention further comprises: a first power source terminal to which the reference potential is applied; a second power source terminal to which the power source potential is applied; a thirteenth MOS transistor of the first conductivity type connected between the first power source terminal and the third output node; and a fourteenth MOS transistor of the first conductivity type connected between the first power source terminal and the fourth output node, wherein the input signal is inputted to a gate of the thirteenth MOS transistor only when the power source potential is not more than the specified value and the inverted input signal is inputted to a gate of the fourteenth MOS transistor only when the power source potential is not more than the specified value. The arrangement allows the level shift circuit to be driven at a high speed even in the case where the power source voltage varies greatly and becomes not more than the gate-source breakdown voltage of the transistor.

DETAILED DESCRIPTION OF THE INVENTION

Embodiment 1

Figure 1:
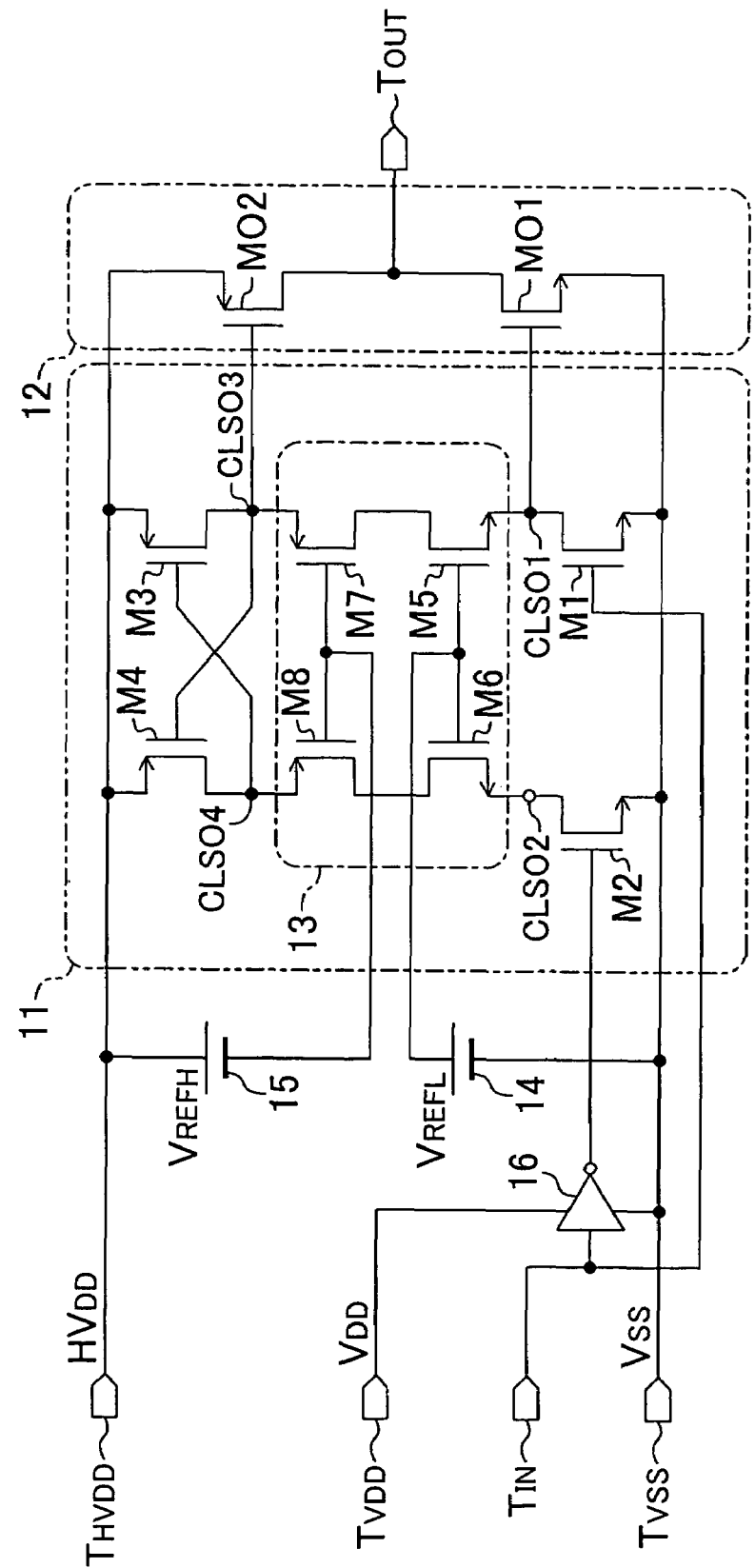
FIG. 1 is a circuit diagram showing a level shift circuit according to a first embodiment of the present invention.

A first embodiment of the present invention will be described with reference to the drawings. FIG. 1 shows a circuit structure of a level shift circuit according to the first embodiment.

As shown in FIG. 1, the level shift circuit according to the present embodiment outputs an input signal inputted from the input terminal $T_{IN}$ and having an amplitude not more than the gate-source breakdown voltage of each of the constituent transistors thereof as a signal with a high-voltage amplitude not less than the gate-source breakdown voltage of the transistor.

The level shifter circuit comprises: a driving circuit 11 for generating a drive signal at a voltage not more than the gate-source breakdown voltage of the transistor from the input signal inputted from the input terminal $T_{IN}$ and a voltage $HV_{DD}$ not less than the gate-source breakdown voltage of the transistor which has been applied to the high-voltage power source terminal $T_{HVDD}$; and an output circuit 12 driven by the drive signal generated in the driving circuit 11.

The driving circuit 11 includes a clamp circuit 13. The clamp circuit 13 has four output nodes. An NMOS transistor M5 and a PMOS transistor M7 are connected in series to each other such that the NMOS transistor M5 is connected to the first output node CLSO1 and the PMOS transistor M7 is connected to the second output node CLSO3. An NMOS transistor M6 and a PMOS transistor M8 are connected in series to each other such that the NMOS transistor M6 is connected to the second output node CLSO2 and the PMOS transistor M8 is connected to the fourth output node CLSO4. To each of the gates of the NMOS transistors M5 and M6, the positive electrode of a first bias power source 14 is connected. To each of the gates of the PMOS transistors M7 and M8, the negative electrode of a second bias power source 15 is connected. The negative electrode of the first bias power source 14 is connected to a ground terminal $T_{VSS}$. The positive electrode of the second bias power source 15 is connected to the high-voltage power source terminal $T_{HVDD}$.

Between the first output node CLSO1 and the ground terminal $T_{VSS}$, an NMOS transistor M1 is connected. Between the second output node CLSO2 and the ground terminal $T_{VSS}$, an NMOS transistor M2 is connected. Between the third output node CLSO3 and the high-voltage power source terminal $T_{HVDD}$, a PMOS transistor M3 is connected. Between the fourth output node CLSO4 and the high-voltage power source terminal $T_{HVDD}$, a PMOS transistor M4 is connected.

The gate of the NMOS transistor M1 is connected to the input terminal $T_{IN}$. The gate of the NMOS transistor M2 is connected to the input terminal $T_{IN}$ via an inverter 16. The gate of the PMOS transistor M3 is connected to the fourth output node CLSO4. The gate of the PMOS transistor M4 is connected to the third output node CLSO3.

The output circuit 12 is composed of an NMOS output transistor MO1 and a PMOS output transistor MO2 which are connected in series to each other such that the NMOS output transistor MO1 is connected to the ground terminal $T_{VSS}$ and the PMOS output transistor MO2 is connected to the high-voltage power source terminal $T_{HVDD}$. The con-necting point between the NMOS output transistor MO1 and the PMOS output transistor MO2 is connected to the output terminal $T_{OUT}$. The gate of the NMOS output transistor MO1 is connected to the first output node CLSO1. The gate of the PMOS output transistor MO2 is connected to the third output node CLSO3.

Figure 2:
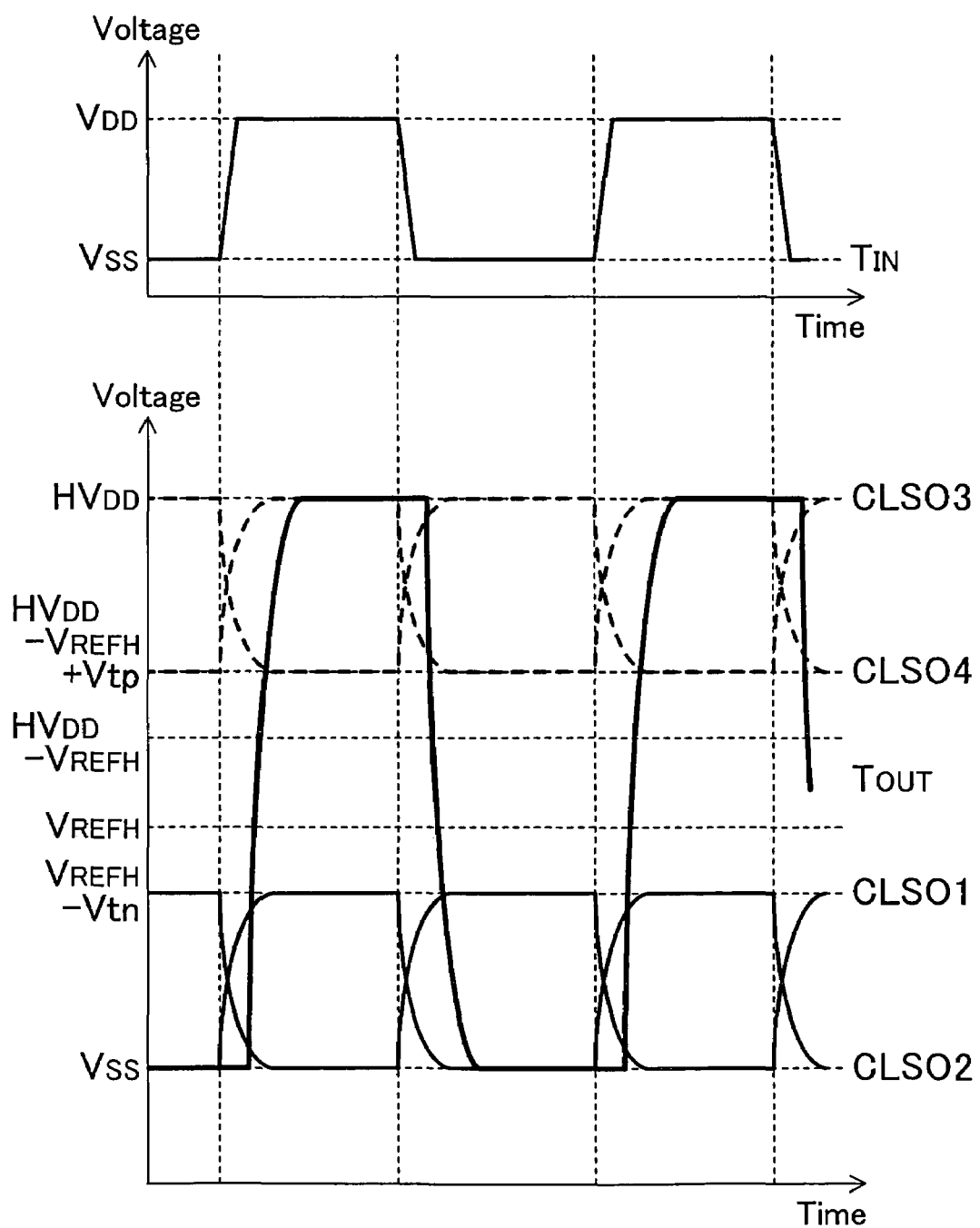
FIG. 2 is a timing chart showing the operation waveform of the level shift circuit according to the first embodiment.

A description will be given herein below to the operation of the level shift circuit according to the first embodiment. FIG. 2 shows the operation waveform of the level shift circuit according to the first embodiment. When the voltage at the input terminal $T_{IN}$ first shifts from the low level ($V_{SS}$ level) to the high level ($V_{DD}$ level), the NMOS transistor M1 is turned ON and the NMOS transistor M2 is turned OFF. As a result of the turning ON of the NMOS transistor M1, the potential at the first output node CLSO1 becomes the $V_{SS}$ level.

On the other hand, as a result of the turning OFF of the NMOS transistor M2, the potential at the second output node CLSO2 rises. However, the potential at the second output node CLSO2 is clamped to the potential which turns OFF the NMOS transistor M6 connected to the first bias power source 14 and having the gate to which a first bias voltage $V_{REFL}$ is applied. When the threshold of the gate-to-source voltage which turns OFF the NMOS transistor M6 is assumed to be $V_{tn}$, the potential at the second output node CLSO2 becomes ($V_{REFL}-V_{tn}$).

In addition, a result of the turning ON of the NMOS transistor M1, the potential at the third output node CLSO3 drops and the PMOS transistor M4 is turned ON so that the potential at the fourth output node CLSO4 rises to the level of the potential HVDD at the high-voltage power source. As a result, the PMOS transistor M3 is turned OFF and the potential at the third output node CLSO3 drops. However, the potential at the third output node CLSO3 is clamped to the potential which turns OFF the PMOS transistor M7 connected to the second bias power source 15 and having the gate to which the voltage ($HV_{DD}-V_{REFH}$) obtained by subtracting a second bias voltage $V_{REFH}$ from the voltage $HV_{DD}$ is applied. When the threshold of the source-to-gate voltage which turns OFF the PMOS transistor M7 is assumed to be $V_{tp}$, the potential at the third output node CLSO3 becomes ($HV_{DD}-V_{REFH}+V_{tp}$).

Since the gate of the NMOS output transistor MO1 is driven by an output from the first output node CLSO1 and the gate of the PMOS output transistor MO2 is driven by an output from the third output node CLSO3, the potential at the output terminal $T_{OUT}$ becomes $HV_{DD}$.

Then, when the potential at the input terminal $T_{IN}$ shifts from the high level ($V_{DD}$ level) to the low level ($V_{SS}$ level), an operation logically opposite to that during the shifting from the low level to the high level is performed. Accordingly, the NMOS transistor M1 and the PMOS transistor M4 are turned OFF and the NMOS transistor M2 and the PMOS transistor M3 are turned ON. The potential at the first output node CLSO1 becomes ($V_{REFL}-V_{tn}$) and the potential at the third output node CLSO3 becomes ($HV_{DD}-V_{REFH}+V_{tp}$). As a result, the NMOS output transistor MO1 is turned ON and the PMOS output transistor MO2 is turned OFF so that the potential at the output terminal $T_{OUT}$ becomes $V_{SS}$.

Thus, the potential at the output terminal $T_{OUT}$ fluctuates upward and downward between the $HV_{DD}$ level and the $V_{SS}$ level in accordance with the input signal which has been inputted from the input terminal $T_{IN}$ and fluctuates upward and downward between the $V_{DD}$ level and the $V_{SS}$ level. On the other hand, the potential at the first output node CLSO1 fluctuates upward and downward between the $V_{SS}$ level and the ($V_{REFL}-V_{tn}$) level and the potential at the third output node CLSO3 fluctuates upward and downward between the $(HV_{DD}-V_{REFL}+V_{tp})$ level and the $HV_{DD}$ level. Therefore, an output signal with an amplitude exceeding the gate-to-source voltage of each of the transistors composing the circuit can be outputted by adjusting the values $(V_{REFL}-V_{tn})$ and $(V_{REFH}-V_{tp})$ such that each of them does not exceed the gate-source breakdown voltage of the transistor.

For example, when the level shift circuit is designed by using typical NMOS and PMOS transistors each having a gate-source breakdown voltage of 5.5 V and a threshold of 0.8 V, the $V_{REFL}$ and $V_{REFH}$ may be adjusted appropriately to a value not more than 6.3 V (e.g., 4 V).

Variation of Embodiment 1

A variation of the first embodiment will be described herein below with reference to the drawings. Since the level shift circuit according to the first embodiment can use a transistor having a low gate-source breakdown voltage even as the output transistor, a CMOS structure is used for each of the transistors composing the circuit. However, there is a case where a higher-voltage output is required. In such a case, the source-drain breakdown voltage presents a problem. For example, when an output of not less than 20 V is required, the source-drain breakdown voltage of a typical CMOS transistor is insufficient. In that case, a transistor having a DMOS (Double diffused MOS) structure may be used appropriately as the output transistor.

Figure 3:
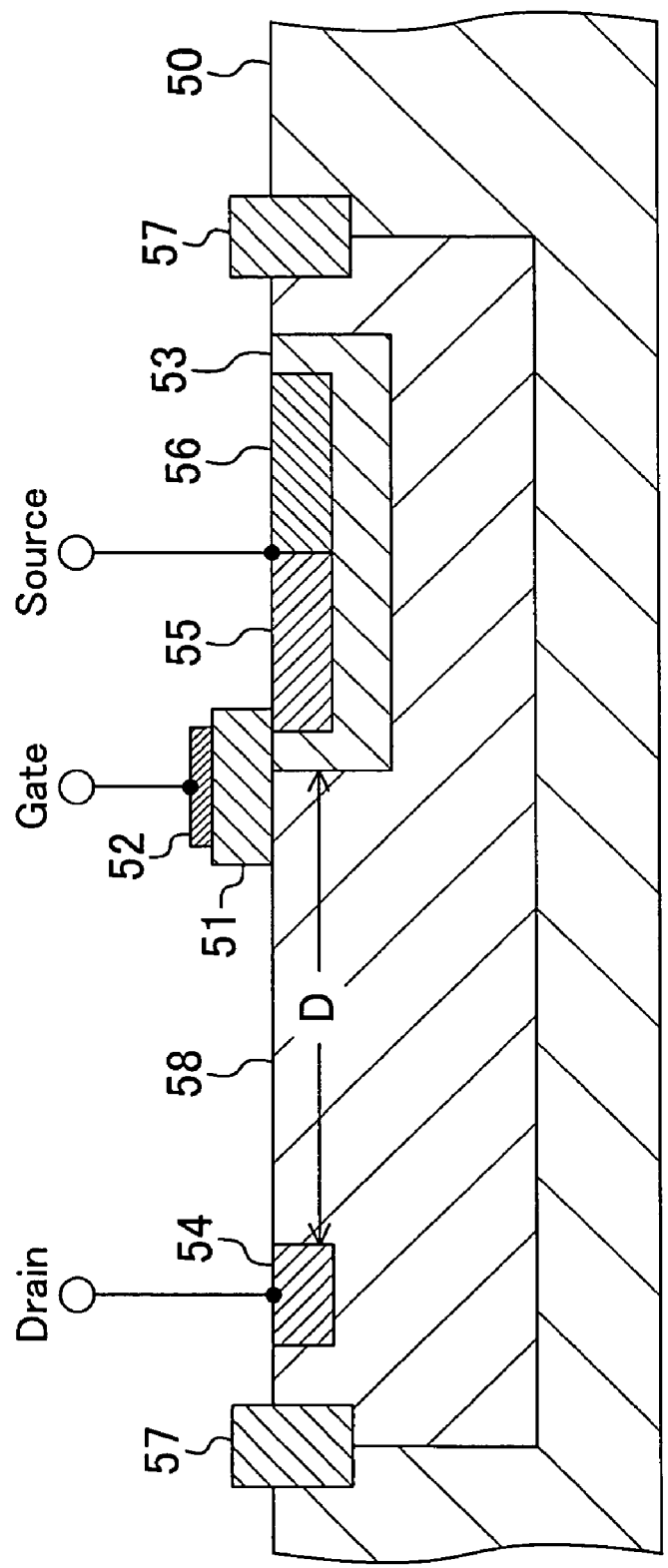
FIG. 3 is a cross-sectional view showing a DMOS transistor used in a level shift circuit according to a variation of the first embodiment.

FIG. 3 shows a cross-sectional structure of a typical N-polarity DMOS transistor. A gate electrode 52 having a gate oxide film 51 is formed on an N-well 58 provided in the region of a substrate 50 isolated by the isolation 57. In the N-well 58, a P-type body region 53 is formed on one side of the gate electrode 52, while a drain composed of an N$^+$ region 54 is formed on the other side thereof, such that the gate electrode 52 is interposed therebetween. In the body region 53, a source composed of an N$^+$-type region 55 and a P$^+$-type region 56 is formed.

In such a DMOS transistor, the source-drain breakdown voltage is determined by the distance D between the N$^+$-type region 54 as the drain and the body region 53. Therefore, even when a high-breakdown-voltage transistor is formed, the size in the gate-width direction thereof need not be changed and design is easy even when the high-breakdown-voltage is provided in mixed relation with a CMOS transistor.

To increase the source-drain breakdown voltage of a CMOS transistor, by contrast, the size in the gate-width direction thereof should be changed and circuit design should be greatly changed. In addition, an exponential increase in breakdown voltage cannot be expected despite the need for the great change.

In the case where some of the transistors composing the level shift circuit are replaced with DMOS transistors, at least the NMOS output transistor MO1 and the PMOS output transistor MO2 may be replaced appropriately. By replacing the NMOS transistors M5 and M6 and PMOS transistors M7 and M8 composing the clamp circuit 13 with DMOS transistors, a larger output amplitude can be obtained.

Embodiment 2

Figure 4:
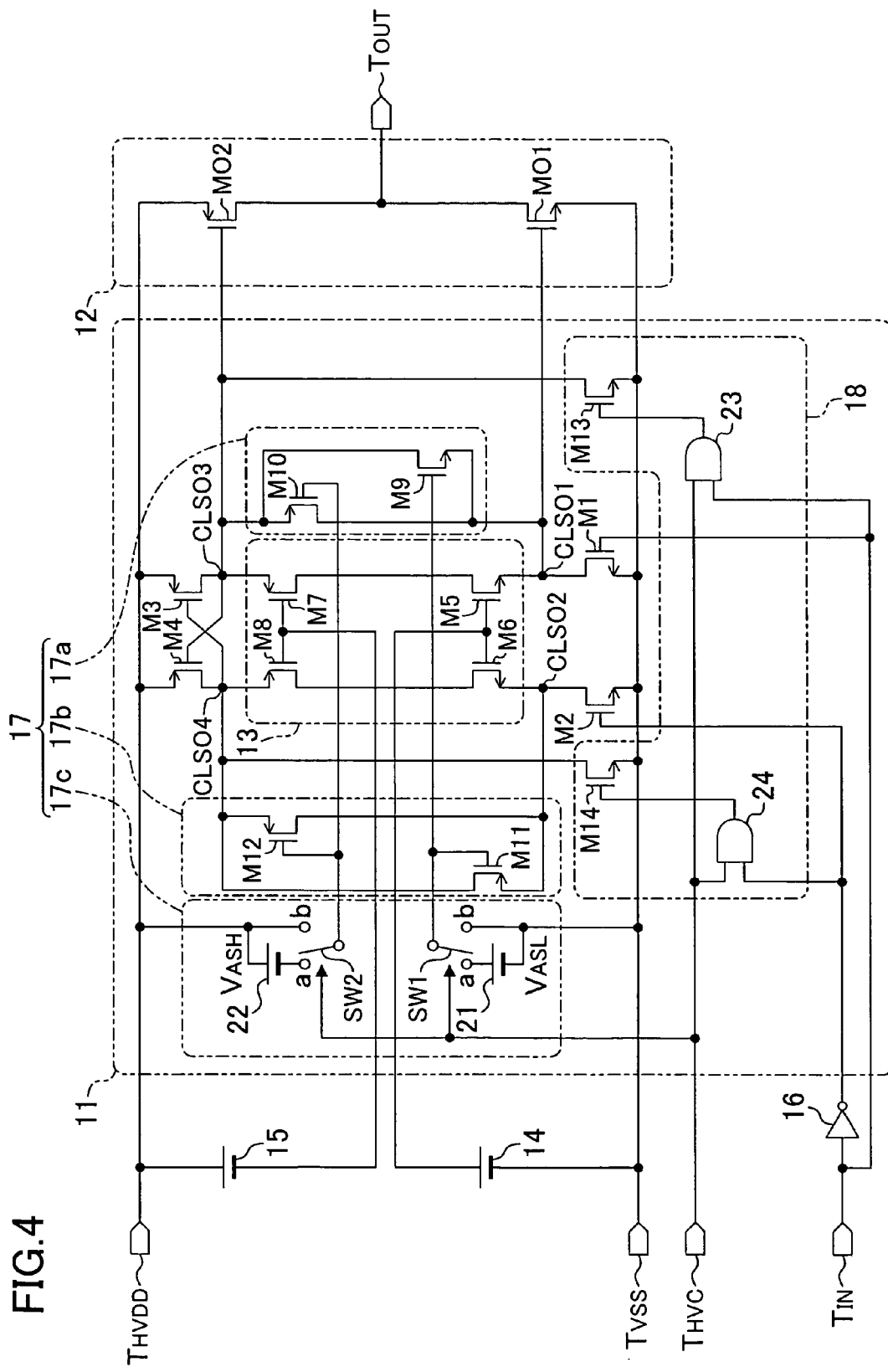
FIG. 4 is a circuit diagram showing a level shift circuit according to a second embodiment of the present invention.

A second embodiment of the present invention will be described herein below with reference to the drawings. FIG. 4 shows a circuit structure of a level shift circuit according to the second embodiment. The description of the components shown in FIG. 4 which are the same as those shown in FIG. 1 will be omitted by retaining the same reference numerals.

In the level shift circuit according to the present embodiment, the voltage $HV_{DD}$ applied to the high-voltage power source terminal $T_{HVDD}$ has a wide operation range. Even when the lower limit value of the voltage $HV_{DD}$ is lower than the gate-source breakdown voltage of any of the transistors composing the circuit, the level shift circuit can be driven at a high speed.

In the first embodiment, the first and second bias voltages $V_{REFL}$ and $V_{REFH}$ have been set appropriately such that each of the values $(V_{REFL}-V_{tn})$ and $(V_{REFH}-V_{tp})$ does not exceed the gate-source breakdown voltage of the transistor. However, the first and second bias voltages $V_{REFL}$ and $V_{REFH}$ cannot be set higher than the voltage $HV_{DD}$. Therefore, when the voltage $HV_{DD}$ applied to the high-voltage power source terminal $T_{HVDD}$ is low, the voltage applied to the gate of each of the transistors of the clamp circuit 13 lowers and the ON-state resistance of the transistor increases. As a result, the clamp circuit 13 becomes high in resistance and the level shift circuit cannot be operated at a high speed any more. Conversely, when the voltage $HV_{DD}$ is lower than the gate-to-source voltage of the transistor, the clamp circuit 13 is unnecessary. Therefore, the level shift circuit according to the present embodiment has adopted the following approach in order to be driven at a high speed even when the voltage $HV_{DD}$ is lower than the gate-source breakdown voltage of the transistor.

As shown in FIG. 4, the level shift circuit according to the present embodiment comprises: a switch circuit 17 providing connection between the first and third output nodes CLSO1 and CLSO3 and between the second and fourth output nodes CLSO2 and CLSO4; and an accelerator circuit 18 providing connection between the third output node CLSO3 and the ground terminal $T_{VSS}$ and between the fourth output node CLSO4 and the ground terminal $T_{VSS}$.

Figure 5:
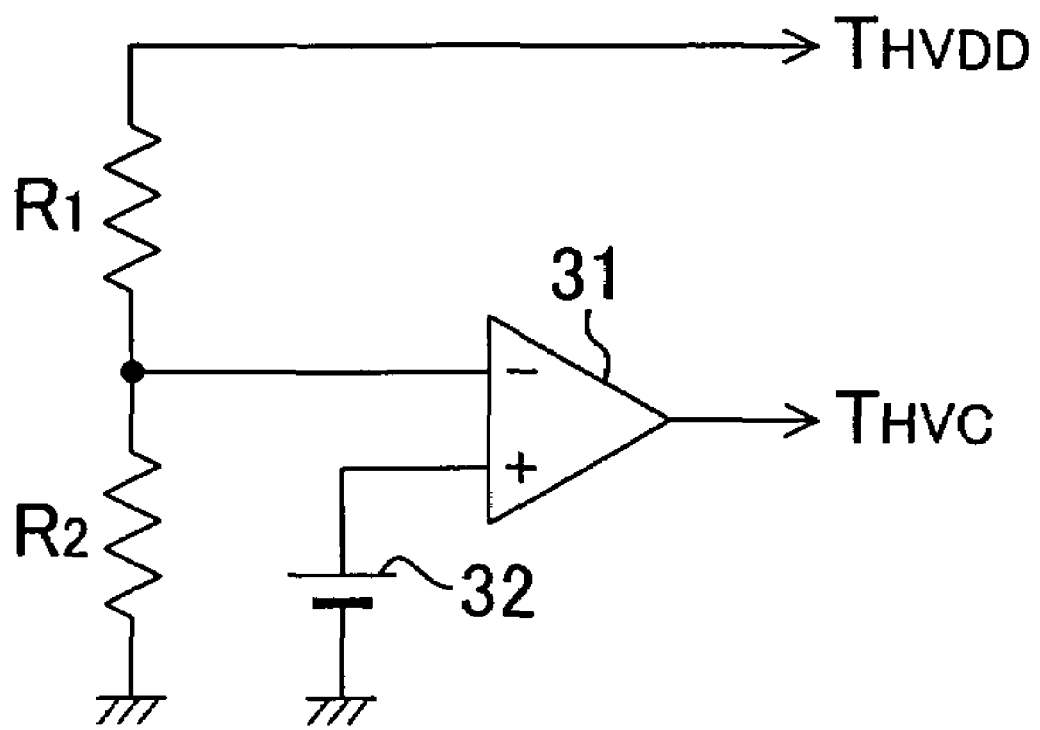
FIG. 5 is a circuit diagram showing an example of a detecting circuit portion of the level shift circuit according to the second embodiment.

The level shift circuit according to the present embodiment also comprises a control terminal $T_{HVC}$ for applying a control signal for controlling the switch circuit 17 and the accelerator circuit 18. The control terminal $T_{HVC}$ is connected to the output of a voltage detecting circuit. The voltage detecting circuit may be composed appropriately of resistor elements R1 and R2 for dividing the voltage $HV_{DD}$, a voltage comparator 31, and a reference power source 32, as shown in, e.g., FIG. 5. Another structure may also be used instead.

As a result, a voltage at the high level is applied to the control terminal $T_{HVC}$ when the voltage $HV_{DD}$ becomes lower than a preset value, while a voltage at the low level is applied thereto when the voltage $HV_{DD}$ becomes higher than a predetermined value. It is sufficient for a voltage for switching the level of the control terminal $T_{HVC}$ to be not more than the gate-source breakdown voltage of each of the transistors composing the circuit. For example, the first bias voltage $V_{REFL}$ or the second bias voltage $V_{REFH}$ may be used as the voltage for switching the level of the control terminal $T_{HVC}$.

The switch circuit 17 has a first switch circuit 17a composed of an NMOS transistor M9 and a PMOS transistor M10 connected between the first and third output nodes CLSO1 and CLSO3 and a second switch circuit 17b composed of an NMOS transistor M11 and a PMOS transistor M12 connected between the second and fourth output nodes CLSO2 and CLSO4.

The switch circuit 17 also has a switch driving circuit 17c for driving the first and second switch circuits 17a and 17b.

The switch driving circuit 17c has switches SW1 and SW2 each driven by a signal applied to the control terminal $T_{HVC}$, a third bias power source 21 connected to the switch SW1, and a fourth bias power source 22 connected to the switch SW2. The third bias power source 21 has a positive electrode connected to the contact point a of the switch SW1 and a negative electrode connected to the ground terminal $T_{VSS}$. The fourth bias power source 22 has a positive electrode connected to the high-voltage power source terminal $T_{HVDD}$ and a negative electrode connected to the contact point a of the switch SW2. The contact point b of the switch SW1 is connected to the ground terminal $T_{VSS}$ and the common contact point of the switch SW1 is connected to the gate of each of the NMOS transistors M9 and M11. The contact point b of the switch SW2 is connected to the high-voltage power source terminal $T_{HVDD}$. The common contact point of the switch SW2 is connected to the gate of each of the PMOS transistors M10 and M12.

Each of the switches SW1 and SW2 is connected to the contact point b when the voltage applied to the terminal $T_{HVC}$ is at the low level, while it connected to the contact point a when the voltage applied to the terminal $T_{HVC}$ is at the high level.

The accelerator circuit 18 has an NMOS transistor M13 connected between the third output node CLSO3 and the ground terminal $T_{VSS}$ and an NMOS transistor M14 connected between the fourth output node CLSO4 and the ground terminal $T_{VSS}$. The gate of the NMOS transistor M13 is connected to the output of a first AND circuit 23. The first AND circuit 23 has one input connected to the control terminal $T_{HVC}$ and the other input connected to the input terminal $T_{IN}$. The gate of the NMOS transistor M14 is connected to the output of a second AND circuit 24. The second AND circuit 24 has one input connected to the control terminal $T_{HVC}$ and the other input connected to the input terminal $T_{IN}$ via the inverter 16.

In FIG. 4, the depiction of power source line for respectively biasing the inverter 16 and the first and second AND circuits 23 and 24 is omitted.

Figure 6:
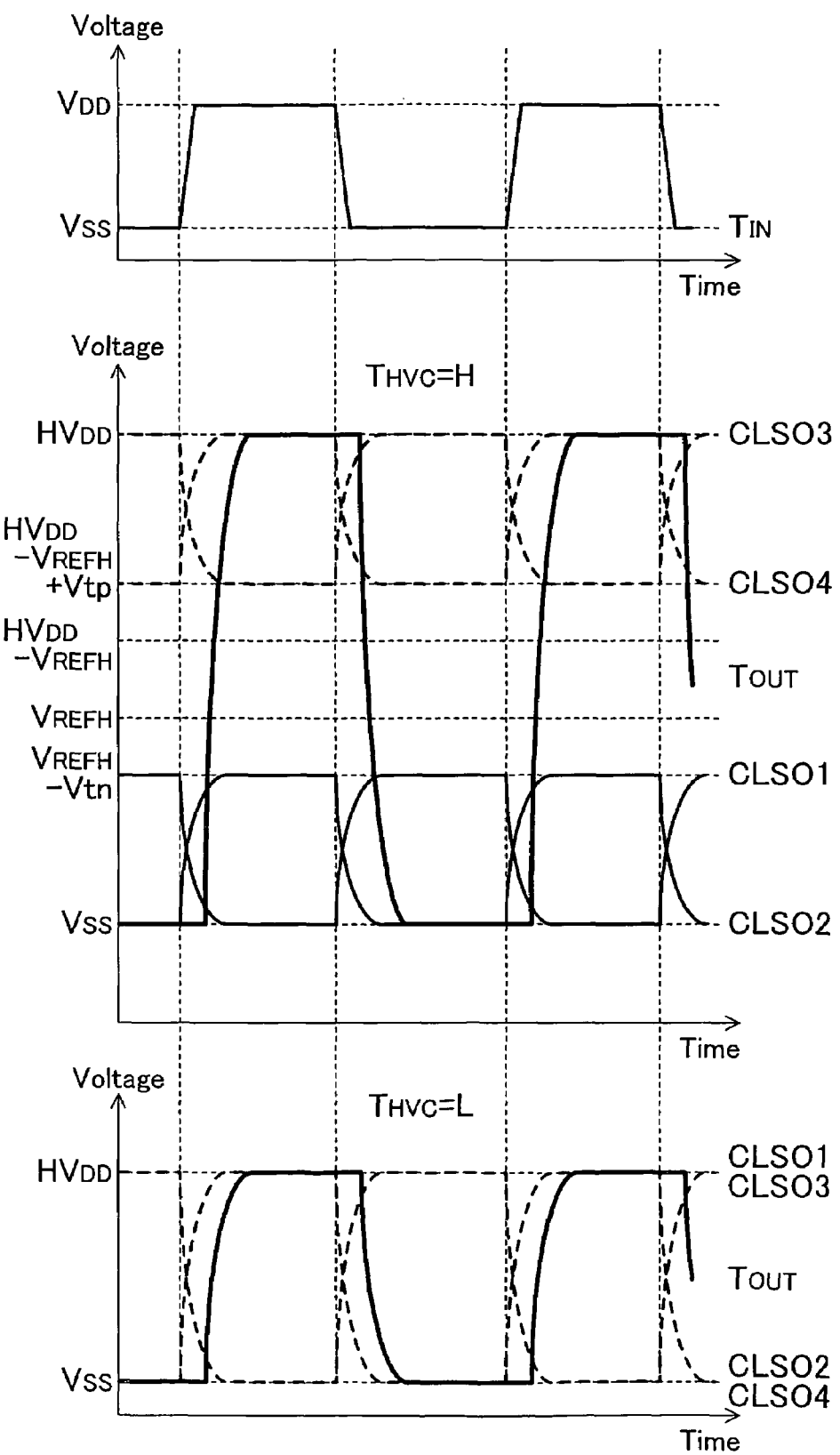
FIG. 6 is a timing chart showing the operation waveform of the level shift circuit according to the second embodiment.
Figure 7:
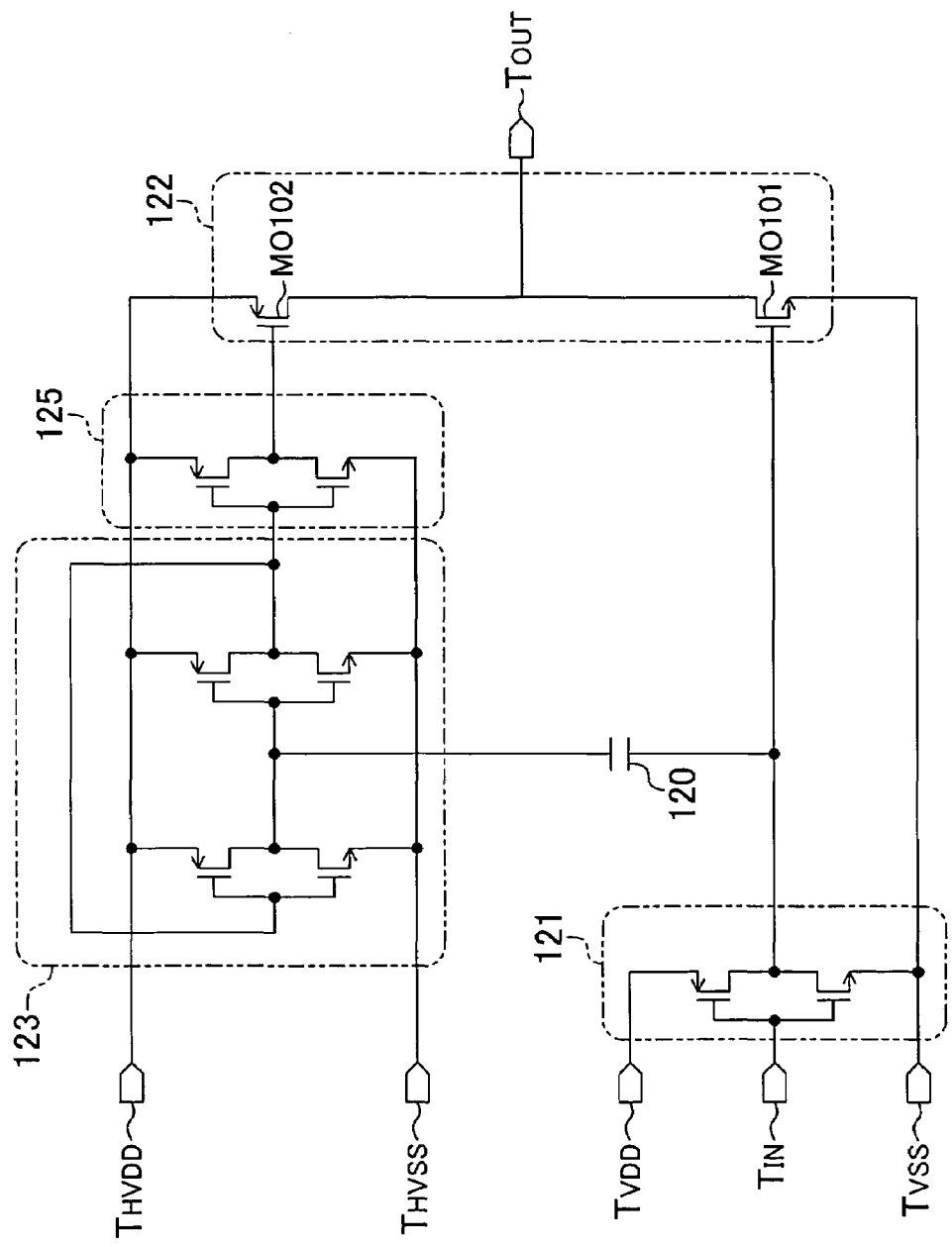
FIG. 7 is a circuit diagram showing a level shift circuit according to a conventional embodiment.

A description will be given herein below to the operation of the level shift circuit according to the second embodiment. FIG. 6 shows the operation waveform of the level shift circuit according to the second embodiment.

The description will be given first to the operation when the voltage $HV_{DD}$ applied to the high-voltage power source terminal $T_{HVDD}$ is not less than a specified value and the voltage applied to the control terminal $T_{HVC}$ is at the low level. In the switch circuit 17, each of the first and second switches is connected to the terminal b. Accordingly, the potential at the gate of each of the NMOS transistors M9 and M11 becomes the VSS level and each of the NMOS transistors M9 and M11 is turned OFF. The potential at the gate of each of the PMOS transistors M10 and M12 becomes the $HV_{DD}$ level and each of the PMOS transistors M10 and M12 is also turned ON. In the accelerator circuit 18, an output from each of the first and second AND circuits 23 and 24 is at the low level ($V_{SS}$ level) so that each of the NMOS transistors M13 and M14 is turned OFF. As a result, the same operation as performed by the level shift circuit according to the first embodiment is performed.

A description will be given next to the operation when the voltage $HV_{DD}$ is not more than the specified value and the voltage applied to the control terminal $T_{HVC}$ is at the high level. In the switch circuit 17, each of the first and second switches is connected to the terminal a so that a third bias voltage $V_{ASL}$ is applied to the gate of each of the NMOS transistors M9 and M11. As a result, each of NMOS transistors M9 and M11 is turned ON. On the other hand, the voltage ($HV_{DD}-V_{ASH}$) obtained by subtracting a fourth bias voltage $V_{ASH}$ from the voltage $HV_{DD}$ is applied to the gate of each of the PMOS transistors M10 and M12. As a result, each of the NMOS transistors M9 and M11 is turned ON. This causes a short-circuit between the first and third output nodes CLSO1 and CLSO3 and a short-circuit between the second and fourth output nodes CLSO2 and CLSO4. As a result, the level shift circuit according to the present embodiment performs the following operation in accordance with the input signal to the input terminal $T_{IN}$.

When the potential at the input terminal $T_{IN}$ shifts from the low level ($V_{SS}$ level) to the high level ($V_{DD}$ level), the NMOS transistor M1 is turned ON and the NMOS transistor M2 is turned OFF. As a result of the turning ON of the NMOS transistor M1, the potential at the first output node CLSO1 drops to the $V_{SS}$ level. At the same time, the potential at the third output node CLSO3 that has been short-circuited to the first output node CLSO1 by the NOMS transistor M9 and the PMOS transistor M10 also drops to the $V_{SS}$ level. As a result, the PMOS transistor M4 is turned ON and the potential at the fourth output node CLSO4 rises to the $HV_{DD}$ level, while the PMOS transistor M3 is turned OFF. At the same time, the potential at the fourth output node CLSO4 that has been short-circuited to the second output node CLSO2 by the NMOS transistor M11 and the PMOS transistor M12 also rises to the $HV_{DD}$ level. The NMOS output transistor MO1 is turned OFF by the potential at the first output node CLSO1 and the PMOS output transistor MO2 is turned ON by the potential at the third output node CLSO3 so that the potential at the output terminal Tour becomes $HV_{DD}$.

Then, when the potential at the input terminal $T_{IN}$ shifts from the high level ($V_{DD}$ level) to the low level ($V_{SS}$ level), an operation logically opposite to that when the potential at the input terminal $T_{IN}$ shifts from the low level to the high level is performed. Accordingly, each of the NMOS transistor M1 and the PMOS transistor M4 is turned OFF and each of the NMOS transistor M2 and the PMOS transistor M3 is turned ON. The potential at the first output node CLSO1 becomes the $HV_{DD}$ level and the potential at the third output node CLSO3 also becomes the $HV_{DD}$ level. As a result, the NMOS output transistor MO1 is turned ON and the PMOS output transistor MO2 is turned OFF so that the potential at the output terminal $T_{OUT}$ becomes the $V_{SS}$ level.

Thus, the clamp circuit 13 which is increased in resistance by the lowering of the voltage $V_{DD}$ applied to the high-voltage power source terminal $T_{HVDD}$ is short-circuited by the switch circuit 17. This solves the problem that the level shift circuit cannot perform a high-speed operation.

When the voltage applied to the control terminal $T_{HVC}$ is at the high level, the output from each of the first and second AND circuits 23 and 24 of the accelerator circuit 18 shifts to the high level ($V_{DD}$ level) in synchronization with the input signal. Accordingly, the same drive signal as applied to the gate of the NMOS transistor M1 is applied to the gate of the NMOS transistor M13 and the same drive signal as applied to the gate of the NMOS transistor M2 is applied to the gate of the NMOS transistor M14. The respective drains of the NMOS transistors M13 and M14 are individually connected directly to the third and fourth output nodes CLSO3 and CLSO4. This allows the respective potentials at the third and fourth output nodes CLSO3 and CLSO4 to shift at high speeds without receiving the influence of the clamp circuit 13 with a higher resistance and the switch circuit 17.

Thus, according to the level shift circuit according to the second embodiment, the operation range of the voltage $HV_{DD}$ applied to the high-voltage power source terminal $T_{HVDD}$ is wide. This allows high-speed operation of the level shift circuit even when the lower limit value of the voltage $HV_{DD}$ is lower than the gate-source breakdown voltage of the transistor.

Although the present embodiment has shown the structure in which each of the switch circuit 17 and the accelerator circuit 18 is provided, it is also possible to adopt a structure in which only the switch circuit 17 is provided. The switch circuit 17 may also be constructed by using another circuit provided that it can cause a short-circuit between the first and third output nodes CLSO1 and CLSO3 and a short-circuit between the second and fourth output nodes CLSO2 and CLSO4.

In the level shift circuit according to the present embodiment also, some of the transistors may be replaced with DMOS transistors in the same manner as in the variation of the first embodiment. In this case, high-breakdown-voltage transistors may be used appropriately also as the transistors composing the switch circuit and the accelerator circuit.

Thus, in accordance with the present invention, a level shift circuit which allows easy circuit design and easy fabrication and outputs a signal with an amplitude exceeding the gate-source breakdown voltage of each of the constituent transistors thereof can be implemented without using a high-breakdown-voltage capacitor.

The level shift circuit according to the present invention is useful as a level shift circuit which outputs a signal with a high-voltage amplitude or the like.

What is claimed is:

1. A level shift circuit comprising:
   a driving circuit including a clamp circuit for receiving first and second bias potentials, outputting first and second drive signals at potentials which are not less than a reference potential, less than the first bias potential, and complementary to each other, and also outputting third and fourth drive signals which are higher than the second bias potential, not more than a power source potential, and complementary to each other; and
   an output circuit including a first output transistor of a first conductivity type and a second output transistor of a second conductivity type which are connected in series to each other, the first output transistor having a gate for receiving the first drive signal and one electrode for receiving the reference potential, the second output transistor having a gate for receiving the third drive signal and one electrode for receiving the power source potential.

2. The level shift circuit of claim 1, wherein the driving circuit includes:
   a first MOS transistor of the first conductivity type having a gate for receiving an input signal, one electrode for receiving the first drive signal, and the other electrode for receiving the reference potential;
   a second MOS transistor of the first conductivity type having a gate for receiving the inverted input signal, one electrode for receiving the second drive signal, and the other electrode for receiving the reference potential;
   a third MOS transistor of the second conductivity type having a gate for receiving the fourth drive signal, one electrode for receiving the third drive signal, and the other electrode for receiving the power source potential; and
   a fourth MOS transistor of the second conductivity type having a gate for receiving the third drive signal, one electrode for receiving the fourth drive signal, and the other electrode for receiving the power source potential.

3. The level shift circuit of claim 1, wherein a potential difference between the reference potential and the power source potential is larger than a gate-source breakdown voltage of each of the first and second output transistors.

4. The level shift circuit of claim 1, wherein each of the first and second output transistors is a double-diffused MOS transistor.

5. The level shift circuit of claim 1, wherein the clamp circuit includes:
   a fifth MOS transistor of the first conductivity type and a sixth MOS transistor of the second conductivity type which are connected in series to each other such that the fifth MOS transistor is connected to a first output node for outputting the first drive signal and the sixth MOS transistor is connected to a third output node for outputting the third drive signal; and
   a seventh MOS transistor of the first conductivity type and an eighth MOS transistor of the second conductivity type which are connected in series to each other such that the seventh MOS transistor is connected to a second output node for outputting the second drive signal and the eighth MOS transistor is connected to a fourth output node for outputting the fourth drive signal, wherein
   a gate of each of the fifth and seventh MOS transistors receives the first bias potential and
   a gate of each of the sixth and eighth MOS transistors receives the second bias potential.

6. The level shift circuit of claim 5, further comprising:
   a first switch connected between the first and third output nodes;
   a second switch connected between the second and fourth output nodes; and
   a switch driving circuit for turning ON each of the first and second switches when the power source potential is not more than a specified value.

7. The level shift circuit of claim 6, wherein
   the first switch includes a ninth MOS transistor of the first conductivity type and a tenth MOS transistor of the second conductivity type which are connected between the first and third output nodes,
   the second switch includes an eleventh MOS transistor of the first conductivity type and a twelfth MOS transistor of the second conductivity type which are connected between the second and fourth output nodes, and
   the switch driving circuit applies a high-level voltage to a gate of each of the ninth and eleventh MOS transistors and also applies a low-level voltage to a gate of each of the tenth and twelfth MOS transistors when the power source potential is not more than the specified value.

8. The level shift circuit of claim 6, further comprising:
   a first power source terminal to which the reference potential is applied;
   a second power source terminal to which the power source potential is applied;
   a thirteenth MOS transistor of the first conductivity type connected between the first power source terminal and the third output node; and
   a fourteenth MOS transistor of the first conductivity type connected between the first power source terminal and the fourth output node, wherein
   the input signal is inputted to a gate of the thirteenth MOS transistor only when the power source potential is not more than the specified value and
   the inverted input signal is inputted to a gate of the fourteenth MOS transistor only when the power source potential is not more than the specified value.

* * * * *